United States Patent [19]

Muraoka et al.

[11] Patent Number: 5,324,966
[45] Date of Patent: Jun. 28, 1994

[54] MOS-CONTROLLED THYRISTOR

[75] Inventors: Kimihiro Muraoka, Kanagawa; Takashige Tamamushi, Tokyo, both of Japan

[73] Assignees: Toyo Denki Seizo Kabushiki Kaisha; Takashige Tamamushi, both of Tokyo, Japan

[21] Appl. No.: 37,023

[22] Filed: Mar. 25, 1993

[30] Foreign Application Priority Data

Apr. 7, 1992 [JP] Japan ............................ 4-114139
Apr. 22, 1992 [JP] Japan ............................ 4-129678

[51] Int. Cl.$^5$ ............................................. H01L 29/74
[52] U.S. Cl. ..................................... 257/136; 257/138; 257/139; 257/330
[58] Field of Search ............... 257/136, 135, 138, 139, 257/137, 330, 498

[56] References Cited

U.S. PATENT DOCUMENTS 5,034,785  7/1991  Blanchard ............................ 257/330

FOREIGN PATENT DOCUMENTS

278119/89  4/1988  Japan ............................ H03K 17/73
292769  12/1991  Japan ............................ H01L 29/74
292770  12/1991  Japan ............................ H01L 29/74

OTHER PUBLICATIONS

Bauer et al Current-Handling and Switching Performance of MOS-Controlled Thyristor (MCT) Structures Electron Device Letters vol. 12, No. 6, Jun. 1991.
Ronsisvalle High Power MOS-Controlled Thyristor Using the Parallel Contacting Technology for Devices on the Same Wafer EOE Firenze, 1991.

Primary Examiner—Sara W. Crane
Attorney, Agent, or Firm—McGlew and Tuttle

[57] ABSTRACT

The present invention has for its object to provide a planar MOS-controlled thyristor of improved main thyristor turn-ON characteristics and a vertical MOS-controlled thyristor of improved main thyristor turn-ON characteristics and increased integration density. In the planar MOS-controlled thyristor a p-channel MOSFET for turning OFF the main thyristor and an n-channel MOSFET for turning it ON are provided in an integrated form and a channel is provided between the cathode region and a high resistance layer. The current in the channel can be controlled by the base or gate potential through utilization of the J-FET or static induction effect. In the vertical MOS-controlled thyristor a vertical p-channel MOSFET for turning OFF the main thyristor and a vertical n-channel MOSFET for turning it ON are provided in an integrated form and a base layer or channel is provided between the cathode region and a high resistivity layer. The current in the base or channel can be controlled by the base or gate potential through utilization of the base resistance effect, J-FET effect, or static induction effect.

2 Claims, 9 Drawing Sheets

MOS-CONTROLLED THYRISTOR

BACKGROUND OF THE INVENTION

1. Field of the Invention

The present invention relates to power semiconductor devices and, more particularly, to a MOS-controlled thyristor of a planar structure wherein p-channel and n-channel MOSFET's have a common gate and a main thyristor is operable by a static induction effect and a MOS-controlled thyristor of a vertical structure wherein vertical p-channel and n-channel MOSFET's have a common gate and a main thyristor is operable by a base resistance effect, JFET effect, or static induction effect.

2. Description of the Prior Art

FIG. 15 schematically illustrates the basic construction of a MOS controlled thyristor, which was proposed by Temple of General Electric Co. Reference numeral 1 denotes an anode electrode, 2 an anode region, 3 an n-type buffer layer, 5 a high resistivity layer, 6 a p-type base layer, 7 a first conductivity type layer, 8 a cathode electrode, 9 a cathode region, 10 a MOS gate electrode, and 11 a second conductivity type layer. The second conductivity type layer 11 and the p-type base layer 6 operate also as a main electrode region of a p-channel MOSFET, and a p-MOS channel is formed in the vicinity of the first conductivity type layer 7 as indicated by 7'. Similarly, the first conductivity type layer 7 and the high resistivity layer 5 operate also as a main electrode region of an n-channel MOSFET, and an n-MOS channel is formed in the vicinity of the p-type base layer as indicated by 6'. The MOS gate electrode 10 is common to both of the n-MOSFET and the p-MOSFET. The $n^+$-type cathode region, the p-type base layer 6, the $n^-$-type high resistivity layer 5, the $n^+$-type buffer layer 3 and the $p^+$-type anode region 2 constitute a main thyristor, which is turned ON and OFF by the application of positive and negative pulse voltages. With the construction of FIG. 15, holes which are carriers stored in the p-type base layer 6 are not drawn out therefrom to an external gate as in a GTO but instead they are short-circuited via the p-channel MOSFET to the second conductivity type layer 11 short-circuited to the cathode electrode 9. What is called a shorted cathode structure is implemented by the p-channel MOSFET between the p-type base layer 6 and the cathode region 8. On the other hand, the n-channel MOSFET functions to turn ON the main thyristor by injecting electrons from the cathode region 8 and the first conductivity type layer 7 into the $n^-$-type high resistivity layer 5 which serves as a second base layer, through the channel of the n-MOSFET.

FIG. 16 schematically illustrates, in section, the construction of another conventional MOS-controlled thyristor, which was published by a research group of Asea Brown Boveri Inc. This construction is disclosed in F. Bauer et al., "Current-Handling and Switching Performance of MOS-controlled Thyristor (MCT) Structures," IEEE EDL Vol. 12, No. 6, June 1991, for instance. In FIG. 16 the parts corresponding to those in FIG. 15 are identified by the same reference numerals. The illustrated structure differs from FIG. 15 example in that the n-MOSFET is not provided for each channel and in that the n-type buffer layer 3 in FIG. 15 is not provided. This prior art example has its feature in that the p-channel MOSFET for cathode short-circuit use is provided around the cathode region 8 in the wide p-type base layer 6. The FIG. 16 example facilitates the formation of a multichannel structure as compared with the FIG. 15 example but calls for the formation of another n-channel MOSFET for turning ON the main thyristor. FIG. 17 is a sectional view schematically illustrating the structure disclosed in C. Ronsisvalle et al., "HIGH POWER MOS-CONTROLLED-THYRISTOR USING THE PARALLEL CONTACTING TECHNOLOGY FOR DEVICES ON THE SAME WAFER," EPE FIRENZE, 1991, pp. 267-269. The parts corresponding to those in FIGS. 15 and 16 are identified by the same reference numerals. This example has its structural feature in that an $n^+$-type region 16 is provided around the p-type base layer 6 to form an n-channel MOSFET in the surface region on the layer 6 at one end thereof.

In the conventional MOS-controlled thyristors of FIGS. 15 through 17, the main thyristor has the same structure as a conventional four-layered thyristor or SCR. In Japanese Patent Laid-Open Gazette No. 278119/89 (filed Apr. 30, 1988) there is described a driving method for a MOS-controlled thyristor wherein the main thyristor is formed as a static induction thyristor and a MOS-controlled system is used, and furthermore, it is stated in the gazette that the thyristor is called a MOS-controlled static induction thyristor in the case where its peripheral elements are integrated. The MOS-controlled static induction (SI) thyristor has a high gate current amplification factor, and hence is operable on a small gate signal. In Nishizawa, "SI Thyristors Hold Promise for Improved DC Power Transmission," PCI & Motor 'Con 88, Munich, West Germany 1988, June 6-8, or Nishizawa and Tamamushi, "Recent Development and Future Potential of the Power Static Induction (SI) Devices," Proceedings of the Third International Conference on Power Electronics and Variable-Speed Drives, Vol. 291, pp. 21-24, July 1988 it is described that the MOS-controlled SI thyristor with only a gate capacitor integrated was made by way of trial up to 600V-3A class and operable with only a gate capacitor $C_G$.

Moreover, an example of a MOS-controlled SI thyristor of the type that only the gate capacitor $C_G$ and/or p-channel MOS transistor for turn OFF use are integrated is disclosed in Japanese Patent Laid-Open Gazette No. 292770/91 or 292769/91.

It is difficult, however, to sufficiently drive a large-capacity SI thyristor by a gate signal of a transient differential waveform which is applied via the gate capacitor. To turn ON the large-capacity SI thyristor uniformly throughout it, it is necessary that the gate capacitor $C_G$ be provided by forming a gate oxide layer on the gate over the entire area of the wafer surface. The capacitance of the gate capacitor $C_G$ depends virtually on the thickness of the gate oxide layer, but it is hard to form such a thin oxide layer on the gate over the entire area of the wafer surface. It is preferable that the gate capacitor $C_G$ be large in capacitance, since the gate drive signal applied across the gate and cathode, but it is difficult to form the gate capacitor $C_G$ large as compared with the gate-cathode capacitance $C_{GK}$. As mentioned above, it has been ascertained that MOS-controlled SI thyristors up to 600V-3A class are operable with only the gate capacitor when it has a small capacitance.

It is therefore desirable to implement a planar MOS-controlled thyristor structure which ensures stable ON- OFF control of a large-capacity thyristor and is easy to manufacture. It is also desirable that the MOS-controlled thyristor be superior to the conventional thyristor in the ratio di/dt for the turn-ON operation, and hence afford reduction of the turn-ON time $t_{gt}$.

On the other hand, an insulated gate bipolar transistor (IGBT), which is inferior to the MOS-controlled thyristor in terms of current capacity but operates similarly under insulated gate control, is superior to the MOS-controlled thyristor in terms of integration density. FIG. 18 is a sectional view schematically illustrating the IGBT structure. Reference numeral 1' indicates a p-type emitter electrode, 8' a p-type collector layer, 9' an IGBT collector electrode, 11' an IGBT emitter electrode, and 17 an IBGT p-type base layer. The other regions 3, 5, 10, 14 and 15 are the same as those in FIG. 17. In FIGS. 15 and 18, reference character L indicates the substantial width of a unit cell. It will be seen that the cell width L of the MOS-controlled thyristor (FIG. 15) is larger than the cell width L of the IGBT (FIG. 18) by the width of a diffused region of the p-type base layer 6. It is considered that the value L is a dimension necessary to implement the unit cell. Assuming that sizing rules for their microfabrication are the same, the value L in FIG. 15 is about $7/5 = 1.4$ times as large as the value L in FIG. 18. To improve the turn-ON characteristic of the MOS-controlled thyristor and reduce its ON-voltage, it is desirable to reduce the unit cell width L and hence increase the integration density.

SUMMARY OF THE INVENTION

It is therefore an object of the present invention to provide a MOS-controlled thyristor of a planar structure which has, in integrated form, a p-channel MOSFET for turn-OFF use and an n-channel MOSFET for turn-ON use and a channel structure between a cathode region and a high-resistance base layer and wherein the current flow in the channel can be controlled by the JFET effect or static induction effect through utilization of the base or gate potential.

Another object of the present invention is to provide a vertical MOS-controlled thyristor which affords reduction of the unit cell width and hence attains an increased integration density.

Another object of the present invention is to provide a vertical MOS-controlled thyristor which shows an improved main thyristor turn-ON capability and permits reduction of main thyristor turn-ON voltage.

Still another object of the present invention is to provide a vertical MOS-controlled thyristor which has a vertical p-channel MOSFET for turning OFF the main thyristor and a vertical n-channel MOSFET for turning ON the main thyristor, both provided in integrated form, and has a channel structure between a cathode region and a high-resistance base layer and in which the current flow in the channel can be controlled by the base resistance effect, JFET effect, or static induction effect through utilization of the base or gate potential.

What is intended to mean by the term "vertical MOS-controlled thyristor" herein used is a MOS-controlled thyristor of the type that n-channel and p-channel MOSFET's for controlling the main thyristor each have an essentially vertical structure.

In an aspect, the present invention is directed to a planar MOS-controlled thyristor which has an anode region and a cathode region provided in first and second main surfaces of a semiconductor substrate, respectively, and a gate region, a p-channel MOSFET and an n-channel MOSFET formed adjacent the cathode region in the vicinity of the first main surface of the substrate. In the planar MOS-controlled thyristor of the present invention a first conductivity type layer (of the same conductivity type as that of the cathode region) is interposed between the gate region and a second conductivity type region (opposite in conductivity type to the cathode region) formed in contact with the cathode region. The second conductivity type region and the gate region serve as main electrodes of the p-channel MOSFET and the first conductivity type region as its channel. The n-channel MOSFET is formed between the first conductivity type layer and a high resistivity layer, the both layers serving as main electrodes of the n-channel MOSFET and the gate region as its channel. A channel region is formed perpendicularly to the substrate surface between the cathode region and the high resistivity layer to control the state of conduction of electrons which are injected thereinto from the cathode region. The channel region is surrounded and substantially depleted by the gate region, and the potential in the channel region varies with the potential of the gate region by the static induction effect. The p-channel MOSFET and the n-channel MOSFET have a common gate electrode which is formed over the first main surface of the substrate, with an insulating layer interposed therebetween, and extends from a position just above a little inside of the second conductivity type region to a position above the marginal edge of the high resistivity layer, crossing over the first conductivity type layer and the gate region. A cathode electrode is provided which short-circuits the cathode region and the second conductivity type region.

The planar MOS-controlled thyristor according to the present invention is characterized in that the n-channel MOSFET is integrated which controls the injection of electrons from the cathode region into the high resistivity layer and that the channel region, which is controlled by the p-type base (gate) layer, is provided between the cathode region and the high resistivity layer.

With such a construction, it is possible to stably turn ON the main thyristor by the n-channel MOSFET. In addition, since the channel region is provided, the aforementioned ratio, di/dt, during the turning-ON of the main thyristor can be set high and the turning-ON time can also be reduced.

In another aspect, the present invention is directed to a vertical MOS-controlled thyristor which has a cathode region and an anode region provided in first and second main surfaces of a semiconductor substrate, respectively, and a base region, a p-channel MOSFET and an n-channel MOSFET formed adjacent the cathode region in the vicinity of the first main surface of the substrate. In the vertical MOS-controlled thyristor according to the present invention a first conductivity type layer (of the same conductivity type as that of the cathode region) is interposed between the base region and a second conductivity type layer (opposite in conductivity type to the cathode region) formed in contact with the cathode region. The second conductivity type region and the base region form main electrodes of the p-channel MOSFET which uses the first conductivity type layer as its channel and has a substantially vertical structure. The n-channel MOSFET, which uses the base region as its channel and has a substantially vertical structure, is formed between the cathode region and a high resistivity layer which serve as main electrodes of the n-channel MOSFET. The base region is formed perpendicularly to the substrate surface between the cathode region and the high resistivity layer to control the state of conduction of electrons which are injected thereinto from the cathode region. The potential of the base region is changed by the base resistance effect. The vertical p-channel MOSFET and the vertical n-channel MOSFET have a common gate electrode which is formed in a groove or trench cut in the first main surface side of the substrate essentially vertically thereto and extending down past the second conductivity type region, the first conductivity type region and the base region and into the high resistivity layer. The gate electrode is separated by an insulating layer from the side wall of the groove. A cathode electrode is provided which short-circuits the cathode region and the second conductivity type region.

In still another aspect, the present invention is directed to a vertical MOS-controlled thyristor which has a cathode region and an anode region provided in first and second main surfaces of a semiconductor substrate, respectively, and a gate region, a p-channel MOSFET and an n-channel MOSFET formed adjacent the cathode region in the vicinity of the first main surface of the substrate. In this vertical MOS-controlled thyristor according to the present invention a first conductivity type layer (of the same conductivity type as that of the cathode region) is interposed between the gate region and a second conductivity type region (opposite in conductivity to the cathode region) formed in contact with the cathode region. The second conductivity type region and the gate region form main electrodes of the p-channel MOSFET which uses the first conductivity type layer as its channel and has a substantially vertical structure. The n-channel MOSFET, which uses the gate region as its channel and has a substantially vertical structure, is formed between the first conductivity type layer and a high resistivity layer which serve as main electrodes of the n-channel MOSFET. A channel region is formed perpendicularly to the substrate surface between the cathode region and the high resistivity layer to control the state of conduction of electrons which are injected thereinto from the cathode region. The channel region is surrounded and substantially depleted by the gate region, and the potential in the channel region varies with the potential of the gate region by the J-FET or static induction effect. The vertical p-channel MOSFET and the vertical n-channel MOSFET have a common gate electrode which is formed in a groove or trench cut in the first main surface side of the substrate essentially vertically thereto and extending down past the second conductivity type region, the first conductivity type region and the gate region and into the high resistivity layer. The gate electrode is separated by an insulating film from the side wall of the groove. A cathode electrode is provided which short-circuits the cathode region and the second conductivity type region.

In the vertical MOS-controlled thyristors according to the present invention, the p-channel and n-channel MOSFET's are both vertically-structured and have a common gate electrode which is formed in a groove cut in the first main surface side of the substrate substantially vertically thereto, and a gate insulating layer is coated all over the side wall of the groove. Thus the gate electrode extends down past the second conductivity type layer, the first conductivity type layer and the p-type base (gate) region and into the n−-type high resistivity layer.

It is also possible to provide between the cathode region and the high resistivity layer a channel region which is controlled by the p-type base (gate) region.

With such a construction, the unit cell width L can be reduced down to 3/7 (approximately 43%) that of the planar MOS-controlled thyristor, and consequently, the integration density increases—this lowers the ON-state voltage.

Moreover, the provision of the channel region enables the afore-mentioned ratio, di/dt, to be set high and affords reduction of the turn-ON time $t_{gt}$.

Other objects, features and advantages of the present invention will become more apparent from the following description taken in cojunction with the accompanying drawings.

DESCRIPTION OF THE PREFERRED EMBODIMENTS

Embodiment 1

Figure 1:
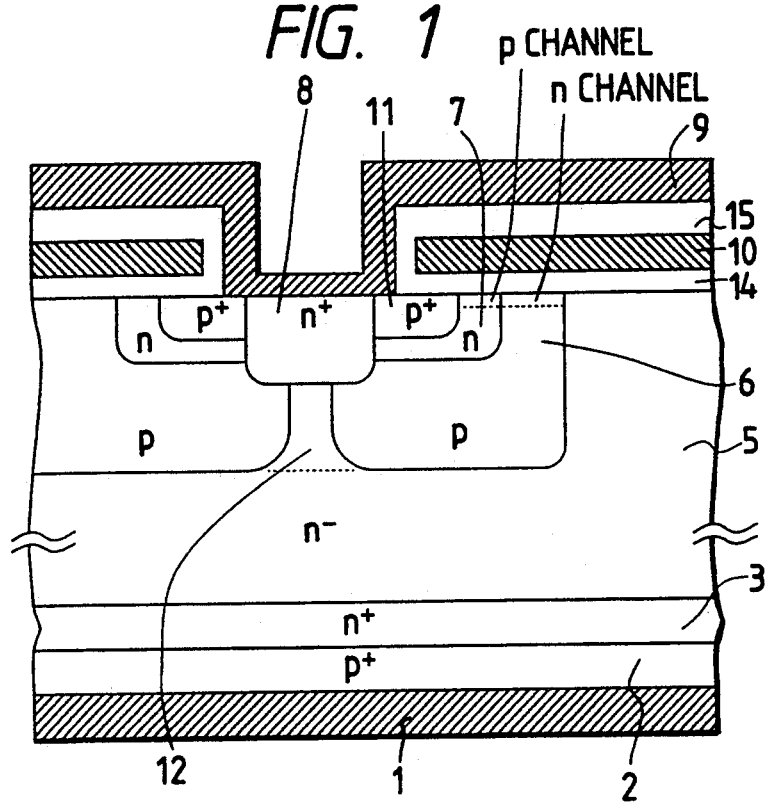
FIG. 1 is a sectional view schematically illustration the internal construction of a planar MOS-controlled thyristor according to a first embodiment of the present invention.

FIG. 1 schematically illustrates, in section, the internal construction of a planar MOS-controlled thyristor according to a first embodiment of the present invention. Reference numeral 1 indicates an anode electrode, 2 an anode region, 3 a buffer layer, 5 a high resistivity layer, 6 a gate (or base) region, 7 an n-type layer, 8 an n+-type cathode region, 9 a cathode electrode, 10 a MOS gate electrode, 11 a p+-type layer, 12 a channel region, and 14 and 15 insulating layers. The insulating layer 14 serves as a gate insulating layer for each of n-channel and p-channel MOSFET's. The p+-type layer 11 is electrically short-circuited to the n+-type cathode region 8 via the cathode electrode 9. A p-type channel is formed in the vicinity of a MOS interface in the n-type layer 7 and an n-type channel is formed in the vicinity of a MOS interface in the p-type base (or gate) region 6. The p+-type layer 11 and the p-type base (or gate) region 6 serve as main electrode regions of a p-MOSFET, whereas the n-type layer 7 and the n−-type high resistivity layer 5 serve as main electrode regions of an n-MOSFET. The channel region 12 needs only to be essentially depleted and is formed as an n−-type or p−-type layer. The flow of electrons in the channel region 12 may be controlled by the JFET effect or static induction effect.

The structure shown in FIG. 1 can be obtained by use of ordinary CMOS, DMOS or n-MOS manufacturing techniques, for instance. The channel length of each MOSFET is, for example, about 2 μm or less. The n+-type cathode region 8 has a depth of, say, 5 μm or less, the p+-type layer 11 has a thickness of 2 μm or less, the n-type layer 7 has a depth of 3 μm or less, and the p-type base (or gate) region 6 has a depth of 10 μm or less, for instance. The width and impurity density of the channel region 12 are selected such that it is sufficiently depleted by the diffusion potential between it and the p-type base region 6. To obtain a predetermined threshold voltage in the vicinity of the MOS interface of each of the p-channel and n-channel MOSFET's, the surface portions of the n-type layer 7 and the p-type base (gate) region 6 are each doped with an impurity. The thickness of the insulating layer 14 may preferably be 1000 Å or less.

This embodiment is not limited specifically to the above-mentioned dimensions. Needless to say, it is preferable, from the viewpoints of microminiaturization of the MOS-controlled thyristor and reduction of its channel length, that the cathode region 8, the p-type base layer 6, etc. be smaller in thickness.

In the planar MOS-controlled thyristor of the present invention, depicted in FIG. 1, the static induction thyristor or that region of the main thyristor where the base layer 6 is formed thin is operated by the static induction effect and that region of the main thyristor where the base layer 6 is formed relatively thick operates in the same manner as does a gate turn-off thyristor (GTO) or silicon controlled rectifier (SCR). The n-channel MOSFET formed in the neighborhood of the substrate surface controls the quantity of electrons which are injected from the cathode region 8. Upon occurrence of the injection of electrons into the high resistivity layer 5, holes are also injected from the anode region 2 into the high resistivity layer 5. As a result, the p-type base layer 6 is charged positive and the injection of electrons from the cathode region 8 into the channel region 12 begins. Once the injection of electrons into the high resistivity layer 5 via the channel region 12 has begun, the n-channel MOSFET need not be held in the ON state, because the number of electrons which are injected from the cathode region 8 into the high resistivity layer 5 via the channel region 12 becomes overwhelmingly large. In this case, however, it does not matter if the n-channel MOSFET remains in the ON state. When the main thyristor is in its latch-up state, the electron current from the cathode region 6 flows via the channel region 12 and the p-type base layer 6 to the anode region 2 and thence to the anode electrode 1, whereas the hole current from the anode region 2 flows via the p-type base layer 6 and the channel region 12 to the cathode region 8 and thence to the cathode electrode 9.

In the case of turning OFF the main thyristor, the p-channel MOSFET is put into the ON state and the n-channel MOSFET is turned OFF. The holes stored in the p-type base layer 6 flows into the p+-type layer 11 via the channel region of the p-channel MOSFET, short-circuiting the layer 11 to the cathode electrode 9. As a result, the diffusion potential of the n+-p junction or n+-p− junction between the cathode region 8 and the p-type base layer 6 or channel region 12 rises, stopping the injection of electrons from the cathode region 8. That is, an increase in the potential of the p-type base layer 6 causes an increase in the potential of the channel region 12, inhibiting the injection of electrons from the cathode region 8. As the result of this, the main thyristor is turned OFF. To hold the main thyristor in the OFF state, it is necessary that the p-channel MOSFET remain in the ON state and that the channel region 12 serve as a normally-off channel. Moreover, the n-channel MOSFET must be held in the OFF state. To hold the main thyristor conductive, it is necessary that the p-channel MOSFET be held in the OFF state and that the channel region 12 be conductive. In this instance, the n-channel needs only to conduct at the time of triggering the turning-ON of the main thyristor, but it is desirable that the p-channel MOSFET be held in the ON state, because the application of the electron current throughout the wafer decreases the ON-state resistance.

Embodiment 2

Figure 2:
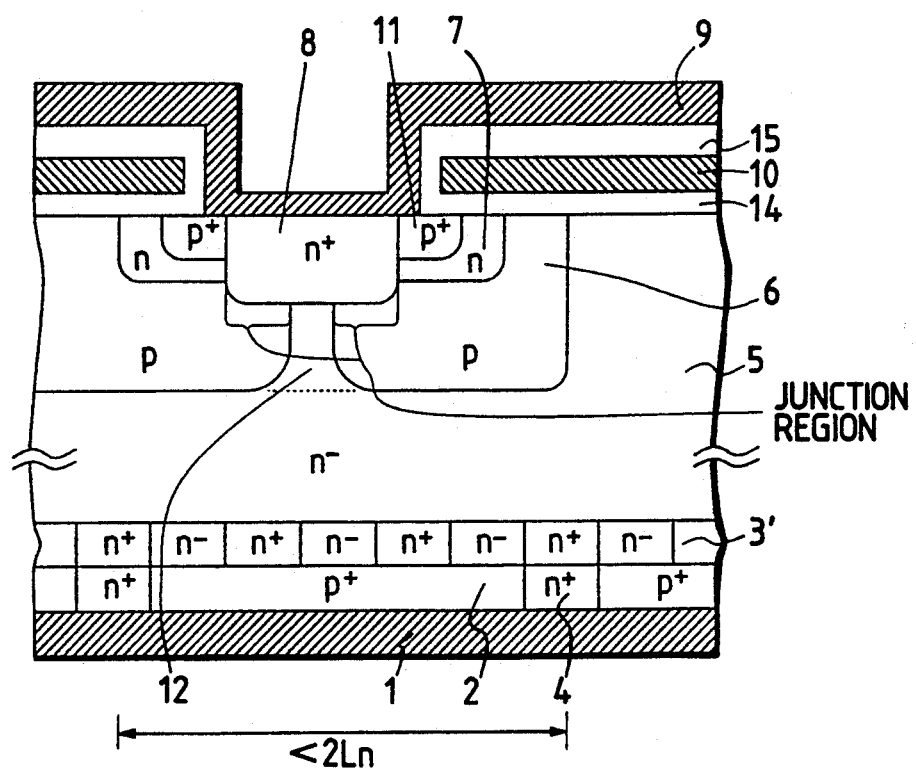
FIG. 2 is a sectional view schematically illustrating the internal construction of a planar MOS-controlled thyristor according to a second embodiment of the present invention.

FIG. 2 is a sectional view, similar to FIG. 1, schematically illustrating the internal construction of a planar MOS-controlled thyristor according to a second embodiment of the present invention. In FIG. 2 the parts corresponding to those in FIG. 1 are identified by the same reference numerals and no detailed description will be given of them. The structural feature of this embodiment resides in that the area of junction between the n+-type cathode region 8 and the p-type base layer (the gate region) is large. This means enlargement of the area over which a hole current flows during the ON state of the main thyristor. When the main thyristor is in the ON state, an electron current flows mostly in the channel region 12 and the p-type base layer 6 and when the n-MOSFET is in the ON state, the electron current flows in its channel portion as well. On the other hand, the hole current flows mainly in the n+-type cathode region 8 from the p-type base layer 6 through the n+p junction formed therebetween. This is because the p-channel MOSFET is in the OFF state. While in the embodiment of FIG. 1 only the electron current is permitted to flow widely over the whole wafer, the embodiment of FIG. 2 has a construction wherein the hole current is also permitted to flow widely over the whole wafer, by widening the n+-type cathode region 8 to enlarge the area of its junction with the p-type base layer 6.

Another feature of this embodiment is to include a static induction buffer layer 3' (of an n+−n−−n+−.. . structure) in place of the buffer layer 3 in the FIG. 1 embodiment. The static induction buffer layer 3' is such as disclosed in Japanese Pat. Appln. No. 114140/92 filed by Muraoka and Tamamushi. Reference numeral 4 indicates buffer short-circuit layers, through which the static induction buffer layer 3' is short-circuited to the anode region 2 at a pitch smaller than 2 Ln (where Ln is the diffusion length of electrons).

The structure at the anode side is not limited specifically to the above-noted structure but may also be a PN structure, shorted anode structure, shorted SI anode structure, double gate structure, MOS-controlled structure, or shorted Schottky structure. Alternatively, it may also be combined with a lifetime control structure.

Figure 3:
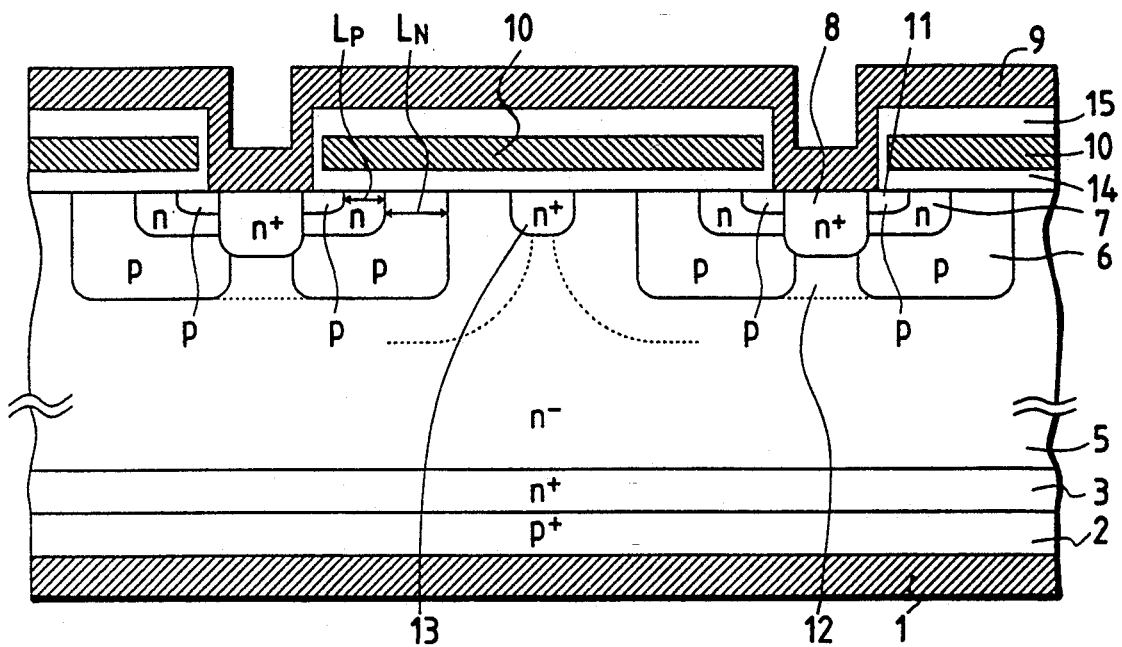
FIG. 3 is a sectional view showing an example in which two planar MOS-controlled thyristors of the first embodiment are arranged side by side.

FIG. 3 schematically illustrates an example of a multi-channel structure in which two MOS-controlled thyristors of the planar structure according to the first embodiment are arranged side by side. The illustrated example needs only to have a construction wherein many structures, each composed of the n+-type cathode region 8, the p+-type layer 11 and the n-type layer 7 formed in the p-type base layer 7, are included and the channel 12 is formed between the n+-type cathode region 8 and the anode region 2. This construction allows ease in the integration of the main thyristor portion and the p-channel MOSFET for turning it OFF. As described previously, the n-channel MOSFET for stably turning ON the main thyristor portion needs to be integrated. It is also possible to form the n-channel MOSFET singly by the first conductivity type layer 7, the p-type base layer 6 and the n−-type high resistivity layer. In the case of forming many MOS-controlled thyristors, it is desired that n-channel MOSFET's be disposed at a predetermined pitch. FIG. 3 shows an example of the multi-channel structure designed, taking into account such an arrangement of n-channel MOSFET's as mentioned above. An n+-type shorted drain layer 13 is formed at a position to which depletion layers spread out from the p-type base layers 6 of the adjoining cells. Electrons injected from the n-type layer 7 flow into the n−-type base layer 5 through the channel in the vicinity of the surface of the p-type base layer 6. It is the n+-type shorted drain layer 13 that serves as a drain for absorbing the electrons injected into the n−-type layer 5. The n+-type shorted drain layer 13 is held equipotential to the n-type buffer layer 3 or anode electrode 1. The n+-type shorted drain layer 13 depicted in FIG. 3 may be provided for each unit cell of the MOS-controlled thyristor, but it may also be provided for each p-type base layer 6 which includes several unit cells, taking into account the integration density. In short, the provision of such drain layers 13 is intended to stably turn ON many unit cells and their arrangement needs only be determined in view of their current capacities.

Figure 4:
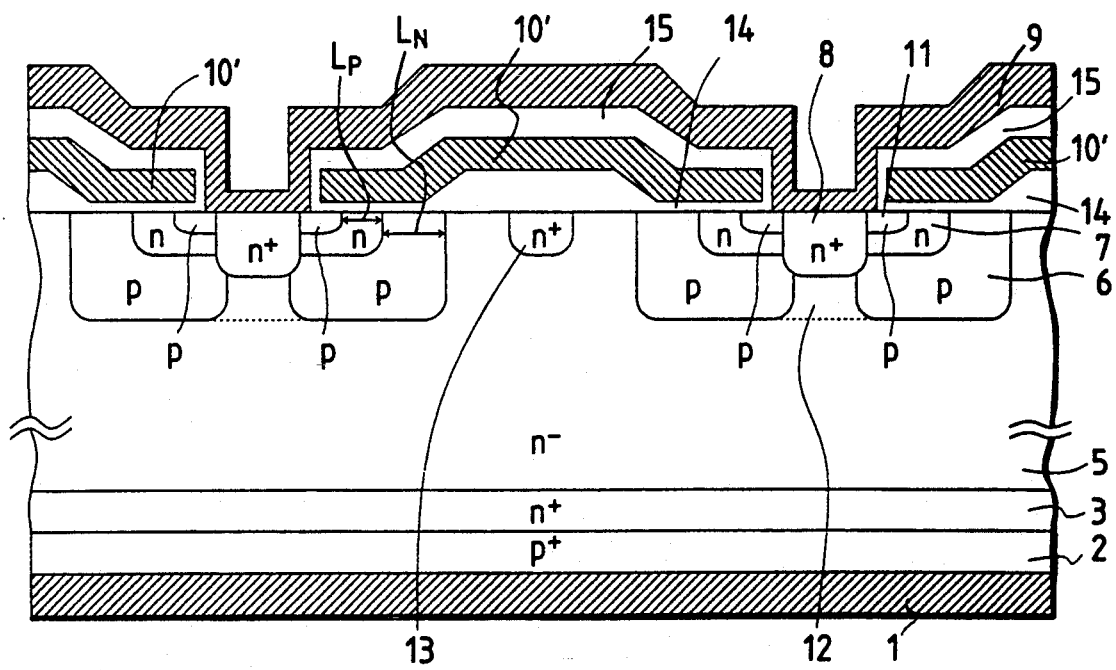
FIG. 4 is a sectional view showing another example in which two planar MOS-controlled thyristors of the first embodiment are arranged side by side.

FIG. 4 shows a modified form of the FIG. 3 example, in which the MOS insulating layer 14 overlaying the n+-type shorted drain layer 13 is formed thick. Reference numeral 10' denotes a MOS gate electrode. Taking into consideration the operation of the n-channel MOSFET of a high withstand voltage, the channel length $L_N$ is defined by the width $L_N$ in the vicinity of the surface of the p-type base layer 6, and the n−-type high resistivity layer 5 between the p-type base layer 6 and the n+-type shorted drain layer 13 is virtually depleted. By virtue of the operation of the p-channel MOSFET, the transconductance Gm is in inverse proportion to the gate-drain capacitance. That is, it is desirable that the gate-drain capacitance be smaller than the gate-channel or gate-source capacitance. Hence, in the example of FIG. 4 the gate-drain capacitance is small. The turn-ON time of the main thyristor could be shortened by improvement in the performance of the n-channel MOSFET.

Embodiment 3

Figure 5:
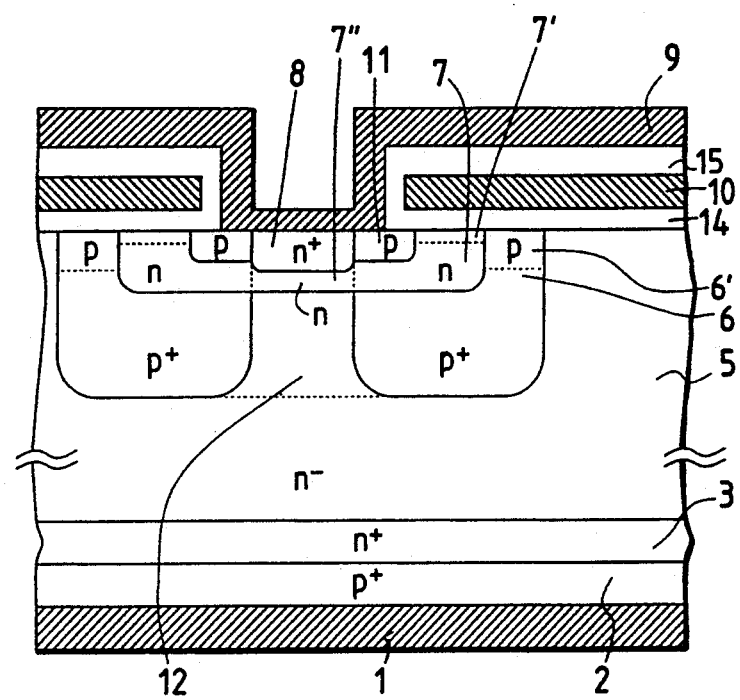
FIG. 5 is a sectional view schematically illustrating the internal construction of a planar MOS-controlled thyristor according to a third embodiment of the present invention.

FIG. 5 is a sectional view schematically illustrating the internal construction of a planar MOS-controlled thyristor according to a third embodiment of the present invention. This embodiment differs from Embodiments 1 (FIG. 1) and 2 (FIG. 2) in that the n+-type cathode region 8 and the p-type base (gate) region 6 are separated by an n-type base layer 7" interposed therebetween, that the impurity density of the p-type base layer 6 is increased higher than in the cases of Embodiments 1 and 2 to definitely define the channel region 12 and that the impurity density of the n-MOS channel region 6' near the surface of the p-type base layer 6 is set low relative to the impurity density of the layer 6 to definitely define the channel region of the n-channel MOSFET. When negative voltage pulses are being applied to the MOS gate electrode 10, holes are injected from the p+-type layer 6 into the n-MOS channel region 6' and the channel region 7' of the p-channel MOSFET is inverted to form a p-type inversion layer. As a result, the holes stored in the p+-type base layer 6 effectively flow into the p-type layer 11, which is shorted to the cathode region 8 via the cathode electrode 9. That is, the gate and the cathode are essentially shorted by the p-channel MOSFET. When positive voltage pulses are applied to the MOS gate electrode 10, the p-channel MOSFET is turned OFF and the n-MOS channel region 6' is inverted to form an n-type inversion layer. In consequence, electrons in the n+-type cathode region 8 are injected via the n-type layer 7 into the n−-type high resistivity layer 5 and holes injected from the anode region 2 are stored in the p+-type base (gate) layer 6, decreasing the barrier height against electrons in the channel region 12 depleted so far or widening the channel region 12. Thus, electrons are injected from the n+-type cathode region 8 into the channel region 12 through the n-type base layer 7'", placing the main thyristor in its latch-up state. With the structure of Embodiment 3, when the main thyristor is in the latch-up state, electrons mostly flow in the channel region 12 and the n-MOS channel region 6', whereas holes flow from the channel region 12 and the gate region 6 to the n+-type cathode region 8 through the n-type base layer 7" and the n-type layer 7.

In the structure of Embodiment 3 the region which permits the passage therethrough of electrons is narrow corresponding to the increased impurity density of the p-type base layer 6, but the controllability of the potential barrier height in the channel region 12 by the static induction effect is improved, providing for enhanced injection efficiency of electrons from the n+-type cathode region 8. The presence of the n-type base layer 7" prevents reduction of the withstand voltage between the p-type base layer 6 and the n+-type cathode region 8. When the impurity densities of the n-type base layer 7" and the neighboring n-type layer 7 are selected low, the withstand voltage will further increase and the number of electrons that are injected from the n+-type cathode region 8 also will increase. When its impurity density and size are suitably selected, the channel region 12 is essentially depleted only by the diffusion potential between it and the p+-type base layer 6 and a sufficiently high potential barrier can be established against the electrons that are injected from the n+-type cathode region 8. By forming the channel region 12 long, the J-FET effect can be obtained. In FIG. 5 the p-type base layer 6 is shown as a relatively large region, but if this layer and the p+-type layer 6' are formed thin and small, the structure of this embodiment can be further miniaturized by a combination of manufacturing processes of a buried gate SI thyristor and a CMOS or DMOS (i.e. n-MOS) FET.

Figure 6:
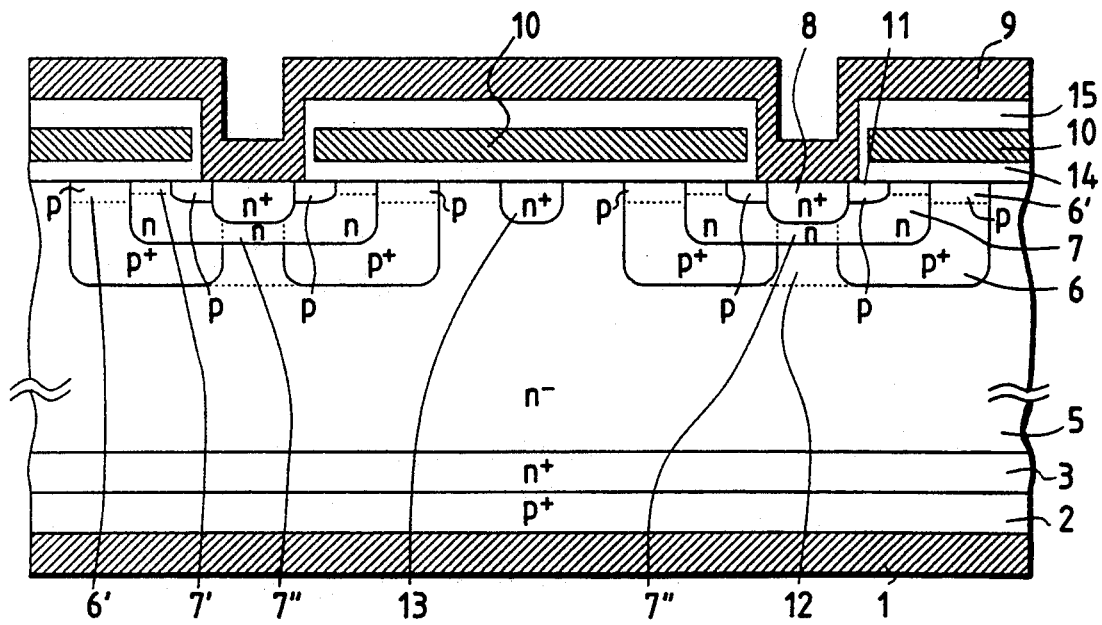
FIG. 6 is a sectional view showing an example in which two planar MOS-controlled thyristors of the third embodiment are arranged side by side.

FIG. 6 shows an example in which two MOS-controlled thyristors of the planar structure according to Embodiment 3 are arranged side by side. Also in this embodiment the n+-type drain short-circuit layer 13 as in the case of FIG. 3.

Embodiment 4

Figure 7:
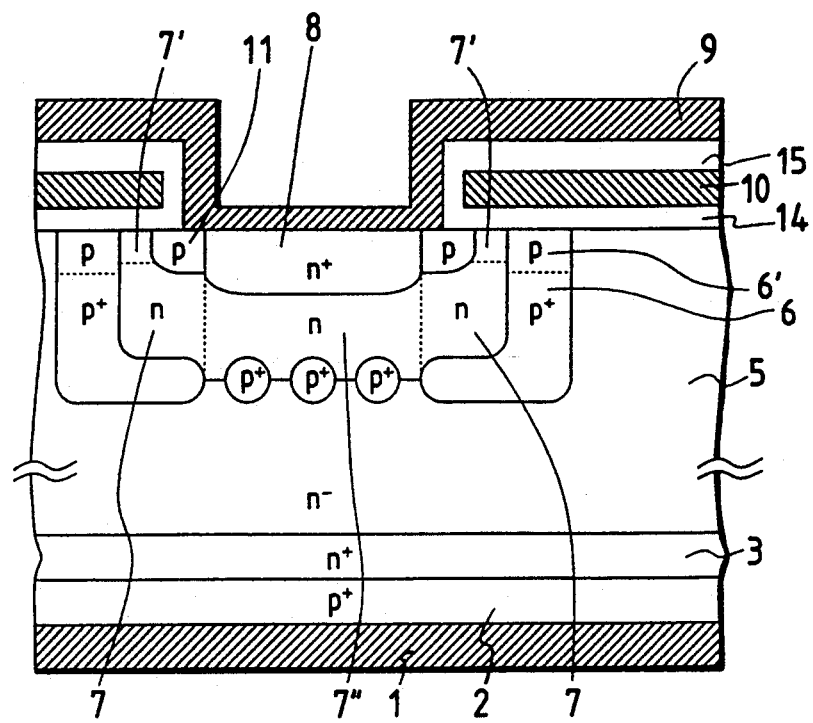
FIG. 7 is a sectional view schematically illustrating the internal construction of a planar MOS-controlled thyristor according to a fourth embodiment of the present invention.

FIG. 7 schematically illustrates, in section, the internal construction of a planar MOS-controlled thyristor according to a fourth embodiment of the present invention. The reason for which the MOS-controlled thyristor of this embodiment is regarded as having the planar structure is that although the main thyristor is formed as an SI thyristor of a buried gate structure, the n-channel and p-channel MOSFET's are both formed along the first main surface of the substrate. In the embodiment of FIG. 7 the parts corresponding to those in Embodiments 1 to 3 are identified by the same reference numerals and no detailed description will be given of them. The structural feature of this embodiment resides in that the gate region 6 of the main thyristor has a normally-OFF buried gate structure. To keep the gate region 6 in the normally-OFF mode, the channel region defined by the buried gate region 6 is substantially depleted and has a potential barrier high enough to inhibit the injection thereinto of electrons from the n+-type cathode region 8. Reference numeral 7" denotes an n-type base layer, 7' a p-MOS channel region, and 6' an n-MOS channel region. The regions 7, 7' and 7" can be formed simultaneously by epitaxial growth after the formation of the buried gate region 6 by diffusion.

The planar MOS-controlled thyristor of Embodiment 4 can be manufactured by a combination of ordinary buried gate or SI thyristor fabrication processes and planar n-MOS, DMOS or CMOS fabrication techniques.

This embodiment can also be applied to a multi-channel structure, wherein such MOS-controlled thyristors as described above are arranged side by side. Also in this case, the n-channel MOSFET's should be arranged taking into account the integration density of the whole structure.

Embodiment 5

Figure 8:
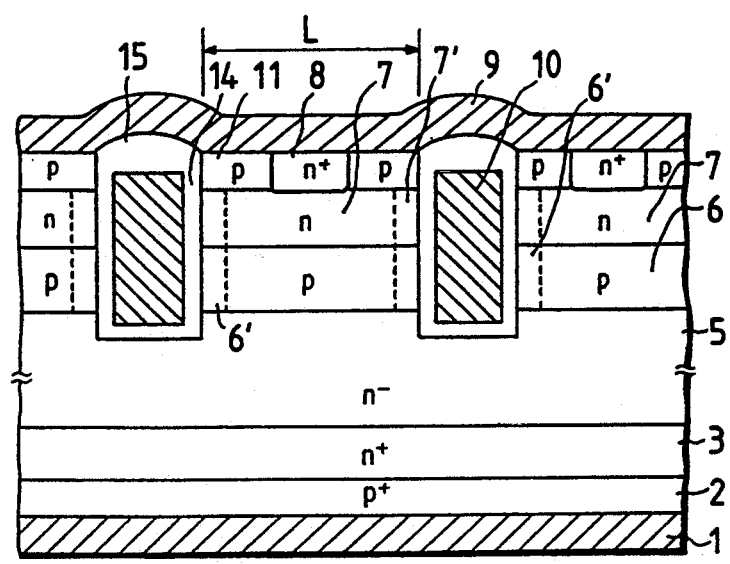
FIG. 8 is a sectional view schematically illustrating the internal construction of a vertical MOS-controlled thyristor according to a fifth embodiment of the present invention.

FIG. 8 schematically illustrates, in section, the internal construction of a vertical MOS-controlled thyristor according to a fifth embodiment of the present invention. In FIG. 8, reference numeral 1 denotes an anode electrode, 2 an anode region, 3 a buffer layer, 5 a high resistivity layer, 6 a base region, 7 an n-type layer, 8 a cathode region, 9 a cathode electrode, 10 a MOS gate electrode, 11 a p-type layer, 6' an n-MOS channel region, 7' a p-MOS channel region, and 14 and 15 insulating layers. The insulating layer 14 serves as a gate insulating layer in common to both n-channel and p-channel vertical MOSFET's. The p-type layer 11 is shorted via the cathode electrode 9 to the n+-type cathode region 8. The p-type channel 7' is formed in the vicinity of the interface of a MOSFET in the n-type layer 7 and the n-type channel 6' is formed in the vicinity of the interface of a MOSFET in the p-type base region 6. The p+-type layer 11 and the p-type base region 6 form main electrode regions of the vertical p-type MOSFET, whereas the n-type layer 7 and the n− -type high resistivity layer 5 form main electrode regions of the vertical n-type MOSFET. Electrons in the base region 6 are controlled by its potential through a base resistance effect.

The vertical MOS-controlled thyristor of this embodiment can be manufactured through use of a U-shaped trench technique and ordinary CMOS, DMOS or n-MOS technology. The channel of each vertical MOSFET has a length of, say, about 2 μm or less. The thickness of the cathode region 8 is, for instance, about 2 μm or less, the thickness of the p-type layer 11 is also 2 μm or less, and the thickness of the n-type layer 7 is 3 μm or less. The p-type base region 6 has a thickness of, for example, 2 μm or less. To attain predetermined threshold voltages near the MOS interfaces of the p-channel and n-channel MOSFET'S, the channel region 7' in the n-type layer 7 and the channel region 6' in the p-type base region 6 are impurity-doped. Incidentally, it is desirable that the insulating layer 14 be formed to a thickness of, say, 1000 Å or less.

Figure 15:
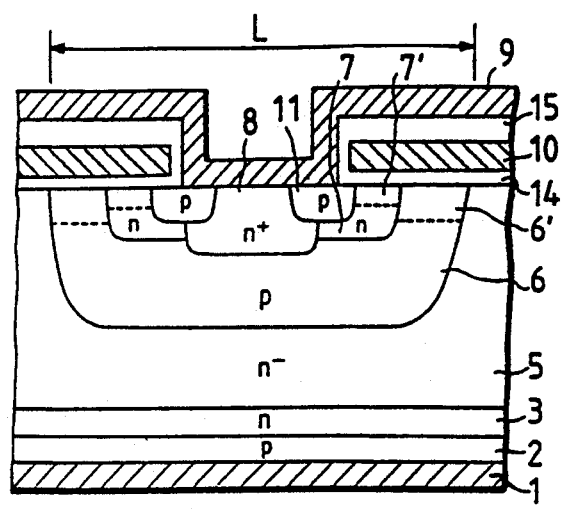
FIG. 15 is a sectional view schematically showing a conventional MOS-controlled thyristor.
Figure 16:
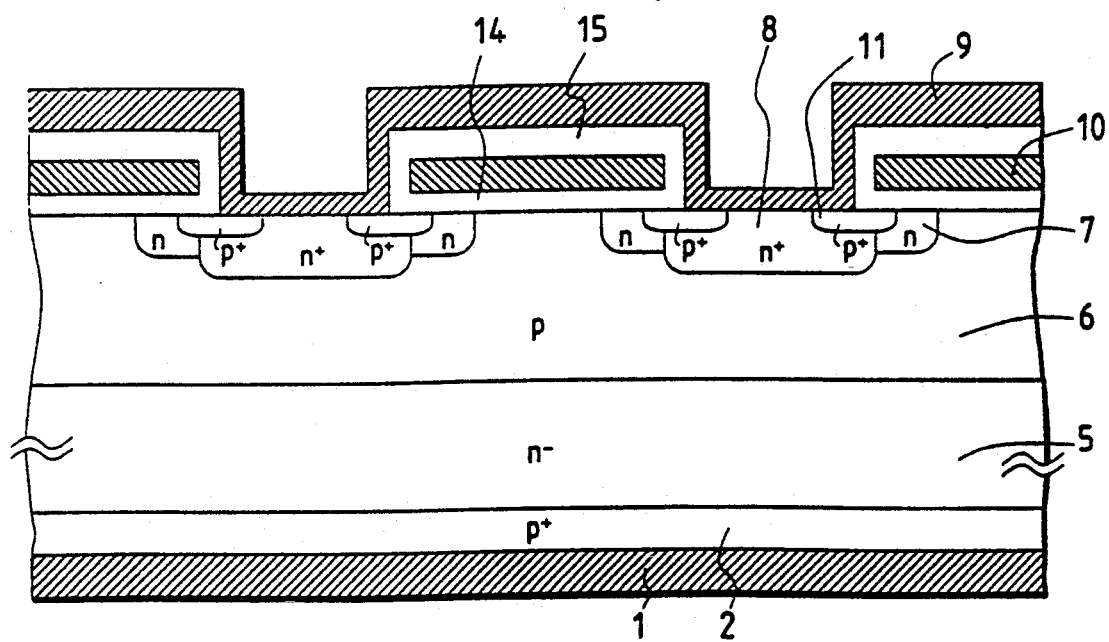
FIG. 16 is a sectional view schematically showing another conventional MOS-controlled thyristor.
Figure 17:
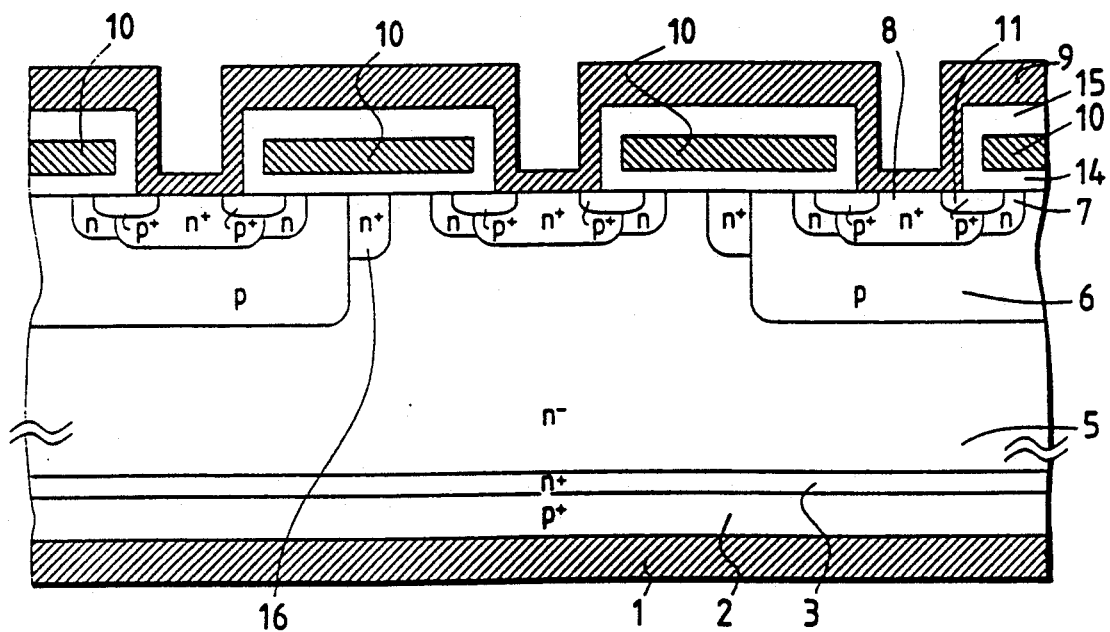
FIG. 17 is a sectional view showing an example in which an n-MOSFET for turning ON the main thyristor is built in the FIG. 16 prior art example.
Figure 18:
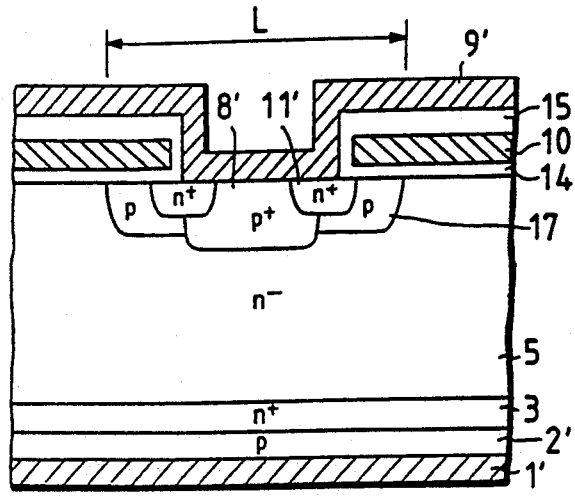
FIG. 18 is a sectional view schematically showing a conventional insulated gate bipolar transistor.

This embodiment is not limited specifically to the above-mentioned sizes. Needless to say, it is desirable, for miniaturization of the whole structure and for reduction of the channel length, that the cathode region 8, the p-type base layer 6, etc. be as thin as possible. The thickness and impurity density of the p-type base layer 6 are important parameters which determine the performance of the main thyristor, in particular, its turn-ON characteristic. The distribution of impurity density in the p-type base layer 6 may be uniform or it may also be such as in the case of a drift base. With the construction of this embodiment, it is possible to form the unit cell in a region about 43% of that needed in the conventional MOS-controlled thyristor depicted in FIG. 15—this increases the integration density and decreases the ON-state voltage.

In the vertical MOS-controlled thyristor according to the present invention, shown in FIG. 8, that region of the main thyristor, i.e. the four-layered or static induction thyristor, where the base layer 6 is formed thin is operated by the static induction effect, and the region where the base layer 6 is relatively thick acts like a GTO or SCR. The vertical n-channel MOSFET, formed in the vicinity of the wafer surface, controls the quantity of electrons which are injected from the cathode region 6 through the n-type layer 7. Upon occurrence of the injection of electrons into the high resistivity layer 5, the injection of holes from the anode region 2 into the high resistivity layer 5 is prompted and the base region 6 is charged positive, with the result that the injection of electrons from the cathode region 8 into the base region 6 or channel 12 is initiated. Once the injection of electrons into the high resistivity layer 5 through the base region 6 or channel 12 is started, the n-channel MOSFET need not be held in the ON stage, because the number of electrons that are injected into the high resistivity layer 5 becomes overwhelmingly large. It does not matter, however, even if the n-channel MOSFET remains in the ON state. In this instance, two vertical n-type inversion layers per unit cell are usually formed in front of the MOS gate. When the main thyristor is in its latch-up state, the electron current from the cathode region 8 flows through the base layer 6 or through the channel 12 and the base layer 6 to the anode region 2 and thence to the anode electrode 1, whereas the hole current from the anode region 12 flows through the base layer 6 or through the base layer 6 and the channel 12 to the cathode region 7 and thence to the cathode electrode 9.

When turning OFF the main thyristor, the p-channel MOSFET is turned ON but the n-channel MOSFET is turned OFF. The holes stored in the baser layer 6 flow into the p-type layer 11 through the channel 7' of the p-channel MOSFET and are shorted to the cathode electrode 9. As a result, the diffusion potential of the $n^+$ np or $n^+$ np$^-$ junction formed by the cathode region 8, the base layer 6 or the channel 12 rises, stopping the injection of electrons from the cathode region 8. In other words, an increase in the potential of the base layer 6 causes an increase in the potential of the base layer 6 itself or the channel 12, inhibiting the injection of electrons from the cathode region 8. Thus, the main thyristor is placed in OFF state. To keep the main thyristor in the OFF state, it is necessary that the p-channel MOSFET be held in the OFF state and that the base layer 6 or channel 12 act as a normally-OFF channel. It is also necessary to hold the n-channel MOSFET in the OFF state. To keep the main thyristor conducting, it is necessary that the p-channel MOSFET be held in the ON state and that the base layer 6 or channel 12 be conducting. In this instance, the n-channel MOSFET needs only to conduct when turning ON the main thyristor, but it may preferably be held ON because the ON-state voltage could be decreased by flowing the electron current over the whole wafer.

While in the above the current in the base layer 6 is controlled by the base resistance, it is evident that the current in the channel 12 is controlled mainly by the J-FET effect or static induction effect.

Embodiment 6

Figure 9:
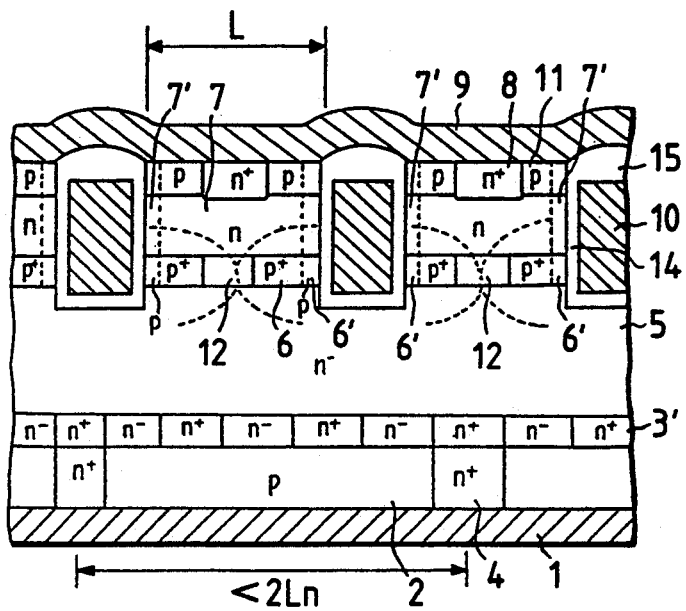
FIG. 9 is a sectional view schematically illustrating the internal construction of a vertical MOS-controlled thyristor according to a sixth embodiment of the present invention.

FIG. 9 schematically illustrates, in section, the internal construction of a vertical MOS-controlled thyristor according to a sixth embodiment of the present invention. In FIG. 9 the parts corresponding to those in FIG. 8 are identified by the same reference numerals and no detailed description will be given of them. This embodiment has such structural features as described below. The channel region 12 is formed in the base layer 6. The width and impurity density of the channel region 12 are selected such that it is substantially depleted by the diffusion potentials between it and the surrounding $p^+$-type gate regions 6 to form a normally-OFF channel. The channel region 12 needs only to be a low impurity density region and is formed as a $p^-$-type, $n^-$-type or i-type layer. The channel region 12 may be controlled by the J-FET effect or static induction effect. The base layer 6 in this embodiment has a $p^+p^-p^+$ structure or $p^+n^-p^+$ or $p^+ip^+$ structure formed in the lateral direction. The region of the base layer 6 near the MOS interface may be doped with an impurity to a medium density so that the n-channel region 6' may be formed as an inversion layer. Similarly, the p-channel region 7' is formed in the n-type layer 7 near the MOS interface.

When the main thyristor is in the ON state, the electron current flows mainly in the channel region 12, and if the n-MOSFET is also in the ON state, the electron current flows in its channel as well. On the other hand, the hole current flows in the cathode region 12 through the base layer 6 or channel region 12. With the structure of the FIG. 9 embodiment, the electron current flows widely over the whole wafer but the hole current flows mostly in the center portion of the channel. In FIG. 9, the cathode region 8 may be widened to increase the area of the junction formed between it and the base layer 6 or channel region 12. This essentially increases the area of the $n^+p$ junction between the cathode region 8 and the base layer 6, enabling the hole current to flow over a wide region.

The embodiment of FIG. 9 employs a static induction buffer layer (of and $n^+n^-n^+$ . . . structure) 3'. This buffer layer is such as disclosed in Japanese Pat. Appln. No. 114140/92 filed by Muraoka and Tamamushi. The region 4 is a buffer shorting layer, by which the buffer layer is shorted to the anode region 2 at a pitch equal to or smaller than about 2Ln (where Ln is the electron diffusion length).

Incidentally, the anode side structure of this embodiment is not limited specifically to the above-mentioned structure including the buffer layer 3' but it may also be a PN structure, shorted anode structure, shorted SI anode structure, double gate structure, MOS-controlled structure or shorted Schottky structure. Of course, it may be combined with lifetime control.

The construction of this embodiment also makes it possible to form the unit cell with about the same width as in the case of the fifth embodiment—this increases the integration density and decreases the ON-state voltage as well. Moreover, the provision of the channel region 12 further improves the main thyristor turn-ON characteristic, that is, the ratio di/dt at the time of turning ON the main thyristor can be set high and the turn-ON time $t_{gt}$ can be reduced.

Figure 10:
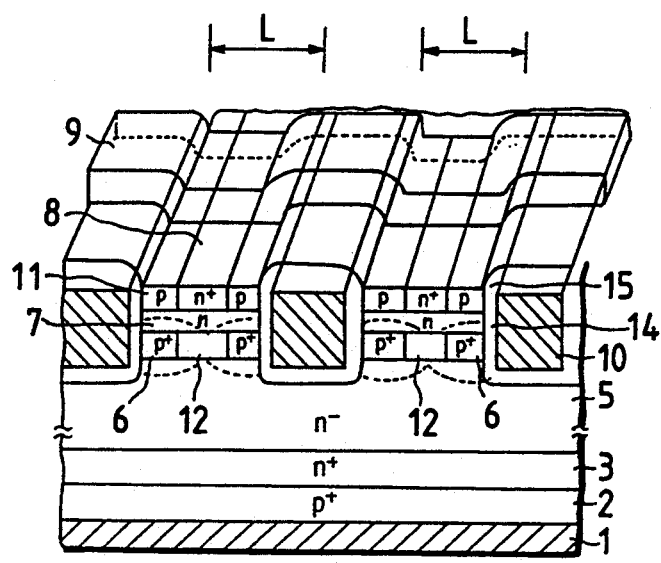
FIG. 10 is a perspective view for explaining the two-dimensional construction of the sixth embodiment of the invention.

FIG. 10 is a perspective view showing the two-dimensional configuration of the sixth embodiment of the invention. The MOS gate electrodes 10 are buried in parallel and at predetermined positions they are electrically interconnected (not shown). The cathode electrodes 9 are formed on the wafer surface, crossing over the MOS gate electrodes 10, by which the $n^+$-type cathode regions 8 and the p-type layers 11 are shorted.

Embodiment 7

Figure 11:
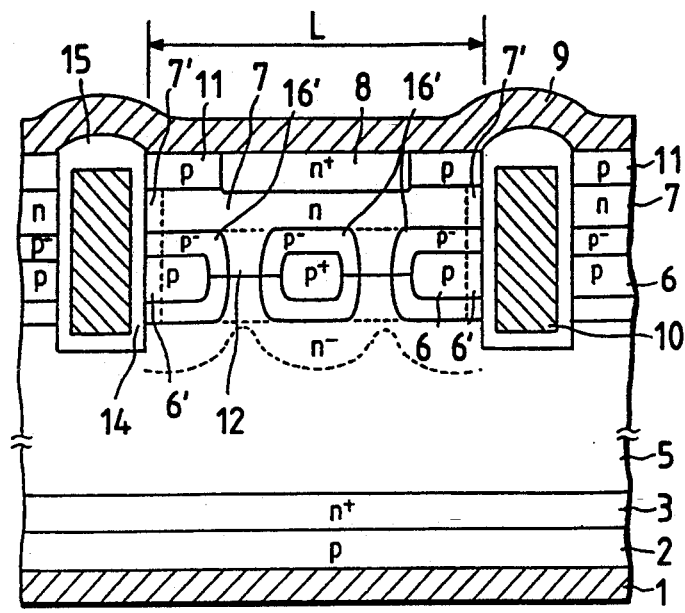
FIG. 11 is a sectional view schematically illustrating the internal construction of a vertical MOS-controlled thyristor according to a seventh embodiment of the present invention.

FIG. 11 schematically illustrates, in section, the internal construction of a vertical MOS-controlled thyristor according to a seventh embodiment of the present invention. The unit cell width L in this embodiment is approximately 5/3 ($\approx 1.7$ times) that in the case of Embodiment 6 (FIG. 9) but 5/7 ($\approx 70\%$) that in the case of the conventional MOS-controlled thyristor. The structural features of this embodiment reside in that two channel regions 12 are provided to essentially increase the current value per unit cell and that the n+-type cathode region 8 is widened to essentially increase the area over which it makes contact with the p-type base layer 6 (p+ p− p+ p− ...) through the n-type layer 7. To implement such structural features, the p-type base layer 6 is formed by p+-type and p-type buried gate regions, which are each surrounded by a relatively low impurity density gate region 16' acting as an electric field relaxation layer. These buried layers are provided in the form of a mesh or ladder, or in stripes, and they are held electrically common to them all. The construction of FIG. 11 can be obtained by a combination of a buried gate SI thyristor manufacturing process and the UMOS, DMOS, CMOS or like technology. The channel regions 12 are each practically depleted by the p-type base or gate regions 6 as in the case of Embodiment 6.

Embodiment 8

Figure 12:
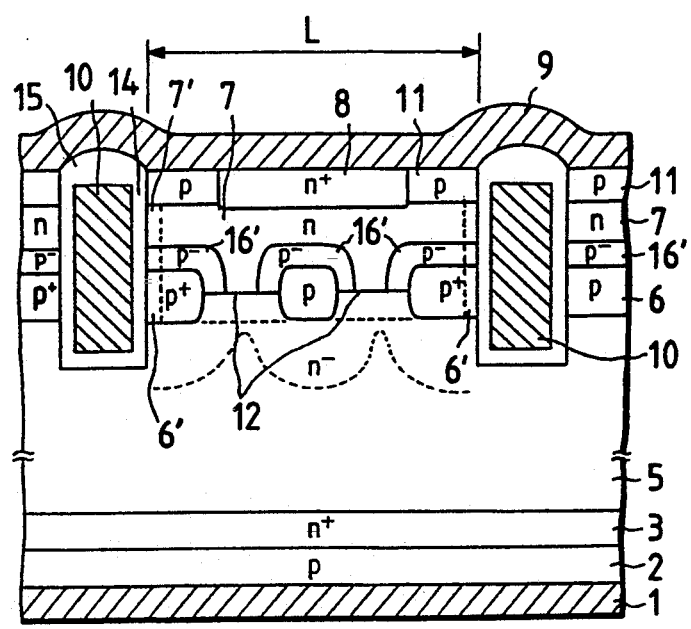
FIG. 12 is a sectional view schematically illustrating the internal construction of a vertical MOS-controlled thyristor according to an eighth embodiment of the present invention.

FIG. 12 schematically illustrates, in section, the internal construction of a vertical MOS-controlled thyristor according to an eighth embodiment of the present invention. This embodiment is a modified form of the embodiment of FIG. 11, in which the intermediate buried gate region has a medium impurity density but the buried gate regions 6 at both sides thereof have high impurity density and the p−-type layers 16' for electric field relaxation use are provided on the side of the p-channel MOSFET alone. In the p+-type buried gate region 6 the n-channel region 6' is formed near the MOS interface, and in the n-type layer 7 the p-channel region 7' is similarly formed near the MOS interface. By forming the intermediate buried layer with a medium impurity density, it is possible to enlarge the region through which the hole current flows when the main thyristor is in the ON state.

Embodiment 9

Figure 13:
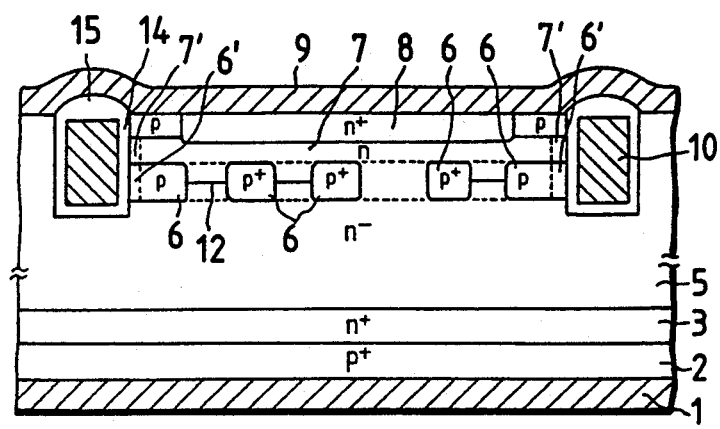
FIG. 13 is a sectional view schematically illustrating the internal construction of a vertical MOS-controlled thyristor according to a ninth embodiment of the present invention.

FIG. 13 schematically illustrates, in section, the internal construction of a vertical MOS-controlled thyristor according to a ninth embodiment of the present invention. This embodiment is another modified form of the embodiment of FIG. 11, in which the buried gate structure (with two channels) in the latter is extended to form a multi-channel structure (with more than two channels). Assuming that the MOS-controlled thyristor of this embodiment has m channels 12, the main thyristor with the m channel is controlled by two p-channel MOSFET's and two n-channel MOSFET's.

$$= \frac{m \text{ (channel)}}{(2m + 1)k(\mu m)} : \frac{1 \text{ channel}}{3k(\mu m)}$$

where k($\mu$m)/minimum line width. In Embodiment 6 of FIG. 9 the main thyristor with one channel is formed by 3 k($\mu$m), whereas in Embodiment 7 of FIG. 11 the main thyristor with two channels is formed by 5 k($\mu$m). Similarly, in Embodiment 9 of FIG. 13, m (channels are implemented by (2 m+1) k($\mu$m). In FIGS. 8 and 9 the unit cell idth L is 3 k($\mu$m); FIGS. 11 and 12 the width L is 5 k($\mu$m); and in FIG. 13 the width L is (2 m+1) k($\mu$m).

The ratios of the number of channels to the unit cell width L in Embodiments 6 and 9 are as follows:

$$= \frac{m \text{ (channels)}}{(2m + 1)k(\mu m)} : \frac{1 \text{ channel}}{3k(\mu m)}$$

It seems that an increase in m is favorable because the number of control channels per unit cell width L converges to $\frac{1}{2}$ k, but in practice, an appropriate value of m exists because of the gate resistance in each buried layer of the gate region 6.

In the FIG. 13 embodiment the p-MOS channel region 7' is formed in the n-type layer 7 near the MOS gate interface and the n-MOS channel region 6' is formed in the gate layer 6 near the MOS gate interface.

Embodiment 10

Figure 14:
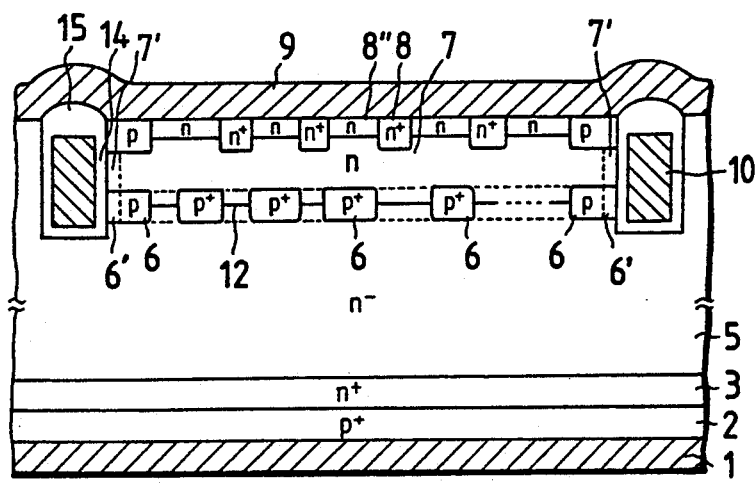
FIG. 14 is a sectional view schematically illustrating the internal construction of a vertical MOS-controlled thyristor according to a tenth embodiment of the present invention.

FIG. 14 schematically illustrates, in section, the internal construction of a vertical MOS-controlled thyristor according to a tenth embodiment of the present invention. In this embodiment the cathode region 8 has an n+−n−n+... structure, an n+-type region is provided opposite each channel region 12 and an n-type region 8'' of a smaller thickness is provided opposite the p+-type buried gate layer 6. This is intended to decrease the capacitance between the p-type base layer 6 and the n-type cathode region 8.

It is a matter of course that the conductivity types of respective regions and layers may be reversed. In such a case, the p-channel MOSFET is used to turn ON the main thyristor and the n-channel MOSFET is to turn it OFF.

It is evident that conventional CMOS, DMOS, n-MOS or UMOS technology can be used for the fabrication of the vertical MOS-controlled thyristors according to the present invention. It is also possible to utilize such technology in combination with a buried gate SI thyristor or buried gate GTO manufacturing process.

The main thyristor portion of the MOS-controlled thyristor according to the present invention is not limited specifically to the four-layered structure, the SCR structure and the GTO structure described previously in connection with the embodiments, but it is also possible to employ a buried gate GTO, a buried gate SI thyristor, a double gate SI thyristor and a double gate GTO. It is also apparent that the planar or vertical MOS-controlled thyristor may also be provided at the anode side.

Also it is possible to use an n-type buffer structure or static induction buffer structure. A shorted anode structure and SI shorted structure may also be employed.

While in the foregoing embodiments the high resistivity layer 5 has been described to be an n−-type layer, it is not limited specifically thereto but may also be a p−-type or i-type layer. In the case where the base (gate) region 6 is n-type, it is desirable that the high resistivity layer 5 be a p−-type layer, taking into account the widening speed of the depletion layer.

Since the planar MOS-controlled thyristor of the present invention has the channel structure that can be controlled by the J-FET or static induction effect, the main thyristor can be turned ON in a shorter time than in the case of the conventional MOS-controlled thyristor. For example, in a 4500V-400A class, the turn-ON time $t_{gt}$ can be held shorter than 0.5 μs. Moreover, the ratio di/dt at the time of turning ON the main thyristor can be set high, and hence the MOS-controlled thyristor rises quickly. Also in the case where the main thyristor is a static induction thyristor, the n-channel and p-channel MOSFET's can be integrated with high density.

With the construction of the vertical MOS-controlled thyristor according to the present invention, the unit cell width can be reduced down to, for example, 3/7 (approximately 43%) that of the conventional planar MOS-controlled thyristor and the integration density can be increased. This improves the main thyristor turn-ON characteristics and permits reduction of the ON-state voltage.

With the provision of the channel structure, it is possible to control the current in the channel by the J-FET or static induction effect, providing for further improved main thyristor turn-ON characteristics. In particular, the turn-ON time can be reduced and the ratio di/dt at the time of turning ON the main thyristor can be increased. That is, a MOS-controlled thyristor of quick rise can be obtained. Coupled with the increased integration density, this contributes to further improving the turn-ON performance as compared with that of the planar MOS-controlled thyristor.

It will be apparent that many modifications and variations may be effected without departing from the scope of the novel concepts of the present invention.

What is claimed is:

1. A planar MOS-controlled thyristor which has an anode region and a cathode region provided in first and second main surfaces of a semiconductor substrate, respectively, and a gate region, a p-channel MOSFET and an n-channel MOSFET formed adjacent said cathode region in the vicinity of said first main surface of said semiconductor substrate, characterized in:

that a layer of the same conductivity type as that of said cathode region is interposed between said gate region and a region formed in contact with said cathode region and opposite in conductivity type thereto, said opposite conductivity type region and said gate region serving as main electrodes of said p-channel MOSFET which uses said same conductivity type layer as its channel;

that said n-channel MOSFET is formed between said same conductivity type layer and a high resistivity layer, said n-channel MOSFET using said same conductivity type layer and said high resistivity layer as its main electrodes and said gate region as its channel;

that a channel region is formed perpendicularly to said substrate surfaces between said cathode region and said high resistivity layer to control the flow of electrons which are injected from said cathode region;

that said channel region is surrounded and essentially depleted by said gate region, the potential in said channel region varying with the potential of said gate region by a static induction effect; and that said p-channel MOSFET and said n-channel MOSFET have a common gate electrode formed over said first main surface of said substrate with an insulating layer interposed therebetween, said common gate electrode extending from a position just above a little inside of said opposite conductivity type region to a position above the marginal edge of said high resistivity layer, crossing over said same conductivity type layer and said gate region, and that a cathode electrode is formed shorting said cathode region and said opposite conductivity type region.

2. A vertical MOS-controlled thyristor which has a cathode region and an anode region formed in first and second main surfaces of a semiconductor substrate, respectively, and a gate region, a substantially vertical p-channel MOSFET and a substantially vertical n-channel MOSFET formed adjacent said cathode region in the vicinity of said first main surface of said semiconductor substrate, characterized in:

that a layer of the same conductivity type as that of said cathode region is formed between said gate region and a region formed in contact with said cathode region and opposite in conductivity type thereto, said opposite conductivity type region and said gate region serving as main electrodes of said p-channel MOSFET which uses said same conductivity layer as its channel;

that said n-channel MOSFET is formed between said same conductivity type layer and a high resistivity layer, said n-channel MOSFET using said same conductivity type layer and said high resistivity layer as its main electrodes and said gate region as its channel;

that a channel region is formed perpendicularly to said substrate surfaces between said cathode region and said high resistivity layer to control the flow of electrons which are injected from said cathode region;

that said channel region is surrounded and essentially depleted by said gate region, the potential in said channel region varying with the potential of said gate region by a J-FET or static induction effect; and that said p-channel MOSFET and said n-channel MOSFET have a common gate electrode formed in a trench cut in said first main surface of said semiconductor substrate substantially perpendicularly thereto and extending down past said opposite conductivity type region, said same conductivity type layer and said gate region and into said high resistivity layer, and insulating layer being interposed between said common gate electrode and the side wall of said trench, and that a cathode electrode is formed shorting said cathode region and said opposite conductivity type region.

* * * * *